(12) United States Patent
Yap (10) Patent No.: US 6,307,528 B1
(45) Date of Patent: Oct. 23, 2001

(54) CONTRAST ORGANIC LIGHT-EMITTING DISPLAY

(75) Inventor: Daniel Yap, Thousand Oaks, CA (US)

(73) Assignee: Hughes Electronics Corporation, El Segundo, CA (US)

( * ) Notice: Subject to any disclaimer, the term of this patent is extended or adjusted under 35 U.S.C. 154(b) by 0 days.

(21) Appl. No.: 08/986,966

(22) Filed: Dec. 8, 1997

(51) Int. Cl.[7] .................................. G09G 3/12; G09G 3/32
(52) U.S. Cl. .......................... 345/45; 345/82; 313/504; 428/690
(58) Field of Search ............................ 345/55, 82, 83, 345/45; 313/504; 428/690; 257/81, 89; 438/22, 99

(56) References Cited

U.S. PATENT DOCUMENTS

| | | | |
|---|---|---|---|
| 4,885,211 | 12/1989 | Tang et al. | 428/457 |
| 5,294,870 | * 3/1994 | Tang et al. | 313/504 |
| 5,641,611 | * 6/1997 | Shieh et al. | 438/35 |
| 5,650,640 | * 7/1997 | Stafford et al. | 257/81 |
| 5,693,962 | * 12/1997 | Shi et al. | 257/89 |
| 5,905,480 | * 5/1999 | Palalau | 345/45 |
| 5,953,587 | * 9/1999 | Forrest et al. | 438/99 |
| 6,013,538 | * 1/2000 | Burrows et al. | 438/22 |

OTHER PUBLICATIONS

G. Gu, V. Bulovic, P.E. Burrows, S.R. Forrest, M.E. Thompson, "Transparent organic light emitting devices", *Appl. Phys. Lett.*, 68 (19), May 6, 1996, pp. 2606–2608.

P. May, "14.4: Light–Emitting Polymers: A Technology for Conformable Graphic Displays", *SID 96 Digest*, May 1996, pp. 192–195.

R. A. Smith, "Semiconductors", Chapter 10 Optical and high–frequency effects in semiconductors; Cambridge University Press, 1978, pp. 291–293.

* cited by examiner

*Primary Examiner*—Richard Hjerpe
*Assistant Examiner*—M. Fatahiyar
(74) *Attorney, Agent, or Firm*—Vijayalakshmi D. Duraiswamy; Michael W. Sales (57) ABSTRACT

A novel organic light-emitting pixel structure provides improved contrast pixels suitable for use in high-contrast passive- and active-matrix displays. A dark, low-reflectance film is placed on a reflective or transparent substrate, which acts to absorb and/or trap ambient light impinging on the pixel and improving its contrast between on and off states. Optical scattering is reduced by fabricating a vertical wall around each pixel which effectively blocks out light emitted from adjacent pixels, and prevents the scattering of the pixel's own emitted light. Light is emitted through a transparent upper electrode, which allows the substrate to be non-transparent. An active-matrix display is thus built on a single silicon substrate, with the crystalline silicon transistors needed to drive the active-matrix fabricated alongside their respective pixels, and with the walls surrounding the pixels formed from the drive circuitry itself.

31 Claims, 5 Drawing Sheets

CONTRAST ORGANIC LIGHT-EMITTING DISPLAY

BACKGROUND OF THE INVENTION

1. Field of the Invention

This invention relates to organic light-emitting displays, and particularly to improved contrast organic light-emitting displays.

2. Description of the Related Art

Research proceeds on many fronts to develop high-resolution displays, for laptop computers, personal communicators and televisions, for example, that are thin, reliable, and low-cost. One technique being actively pursued makes use of the light-emitting properties of certain organic materials. These materials, such as aluminum tris 8-hydroxyquninoline ($Alq_3$) , are sandwiched between anode and cathode electrodes, and emit light when a voltage is applied across the electrodes.

One organic-material-based display is discussed in P. May, "Light-Emitting Polymers: A Technology for Conformable Graphic Displays", SID 96 Digest, paper 14.4, pp. 192–195. The display is configured as a two-dimensional array of individually addressable pixels which form a passive-matrix display. The display's electrodes are formed as first and second layers of parallel strips, with a continuous sheet of organic material sandwiched between the two layers. The electrode strips of the upper layer are oriented perpendicular to the strips of the lower layer, and pixels are formed at the points where the perpendicular electrodes cross. The perpendicular electrode strips act as addressing lines: light is emitted from an individual pixel when a voltage is applied across its upper and lower electrodes so that a current passes through the organic material sandwiched between them.

This arrangement suffers from several problems, however, including poor contrast, optical and electrical crosstalk, and low brightness. Such a display suffers from poor contrast due to the reflective nature of the upper electrodes: the upper electrode strips serve as cathodes, and are made from magnesium-silver (Mg—Ag) a highly reflective material. Ambient light passing through the transparent substrate bounces off the reflective cathodes, which significantly limits the contrast between the pixel's "on state", i.e., when the pixel is emitting light, and its "off state".

Because the organic material is one continuous sheet, light spreads from one pixel region to another, resulting in optical crosstalk. The continuous nature of the organic material also leads to electrical crosstalk between pixels. Further crosstalk problems arise due to the fact that the emitted light travels from the organic material to the viewer through the lower electrode strips and through the substrate, requiring both the lower electrodes and the substrate to be a transparent material. The lower electrodes serve as anodes and are made from indium-tin-oxide (ITO), which has a refractive index of about 2.2. The substrate is typically glass, with a refractive index of about 1.5, and air has an index of 1. Due to these different indices, some light is trapped in both the ITO and glass layers, resulting in optical crosstalk and reduced efficiency.

Displays based on organic light-emitting materials are fabricated on glass substrates, with light emitted through the glass. However, because a glass substrate does not support the fabrication of crystalline silicon transistors (which require a silicon substrate), such displays are limited to the passive-matrix type, which have driving transistors placed at the end of each electrode strip/address line only. Active-matrix displays, on the other hand, which are generally preferred due to their superior brightness, place one or more driving transistors at each pixel; this provides for a greater current flow through and an increased brightness from each addressed pixel.

Some efforts have been directed towards display structures which emit light through a transparent upper electrode, as well as through a glass substrate. These displays, discussed for example in U.S. Pat. No. 4,885,211 to Tang et al. and in G. Gu, "Transparent organic light emitting devices," Appl. Phys. Lett., vol. 68, No. 19 (1996), pp. 2606–2608, are essentially "see-through" devices. However, as with the glass substrate devices discussed above, the transparent nature of the displays limits the amount of contrast which can be obtained between their pixels' on and off states.

SUMMARY OF THE INVENTION

An organic light-emitting pixel structure is presented which overcomes the problems noted above. The novel pixels are arranged into two-dimensional arrays to form high-contrast passive- and active-matrix displays.

The invention makes use of an organic light-emitting material sandwiched between an anode and a cathode. Improved contrast over the prior art is achieved by reducing the amount of ambient light reflected by the pixel, and by reducing the optical scattering between pixels: two of the inherent drawbacks of prior art designs. Reflection of ambient light is reduced by placing a dark, low-reflectance film between a reflective or transparent substrate and the electrode on the substrate side of the organic material. The dark film acts to absorb and/or trap ambient light incident on the pixel, improving the pixel's contrast between on and off states. Optical scattering is reduced by fabricating a vertical wall around each pixel. The wall extends above the pixel's top electrode, effectively blocking out light emitted from adjacent pixels and preventing the scattering of the pixel's own emitted light.

Light emitted from the invention's organic material preferably leaves the pixel through a transparent upper electrode, rather than through the substrate. This reduces the number of material layers through which emitted light must pass from two to one, which decreases the amount of light trapped due to differing refractive indices and increases the pixel's efficiency. Having the emitted light exit through the upper electrode also allows the substrate to be non-transparent. An active-matrix display can be built on a single silicon substrate, with the crystalline silicon transistors needed to drive the active-matrix fabricated alongside their respective pixels. Other non-transparent substrate materials, such as high thermal conductivity materials like metal or diamond, can also be used.

In the case of an active-matrix display, the walls surrounding the pixels are preferably formed from the drive circuitry itself, with the transistors, capacitors, component interconnections and addressing lines stacked up in the spaces between the pixels to form the walls. Alternatively, metal or dielectric materials can be deposited to create the surrounding walls, particularly for displays which do not have circuit components at each pixel, such as a passive-matrix display. The height of the walls surrounding the pixels is made greater than the pixels themselves to block unwanted light out and to keep locally emitted light in.

The corners of the walls surrounding the pixels also serve to physically partition the organic material, which is deposited as a continuous layer, so that each pixel has its own distinct square of organic material. This optically and electrically isolates the pixels, reducing both electrical and optical crosstalk between pixels.

Further features and advantages of the invention will be apparent to those skilled in the art from the following detailed description, taken together with the accompanying drawings.

BRIEF DESCRIPTION OF THE DRAWINGS

FIG. 2b is a plan view which corresponds to the sectional view of FIG. 2a.

FIG. 4b is a schematic diagram of an active-matrix drive circuit that could be used with the active-matrix display of FIG. 4a.

DETAILED DESCRIPTION OF THE INVENTION

Figure 1A:
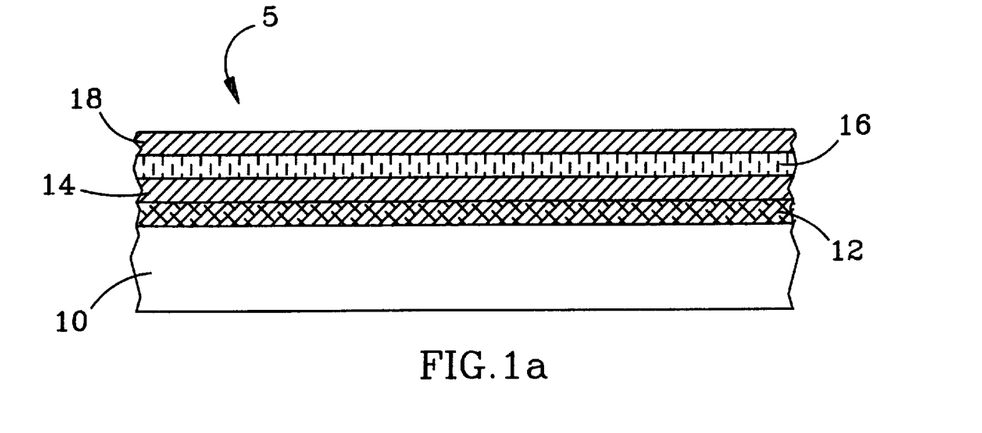
FIG. 1a is a cross-sectional view of an organic light-emitting pixel which includes a dark, low-reflectance film.

A cross-sectional view of an organic light-emitting pixel 5 per the present invention is shown in FIG. 1a. The bottom layer of the pixel structure is a substrate 10. Deposited on the substrate is a dark, low-reflectance film 12. Above the dark film is a lower electrode 14, which is preferably transparent. Deposited above the lower electrode is an organic material layer 16, also preferably transparent, and above the organic layer is deposited a preferably transparent upper electrode 18.

The pixel 5 is made to emit light by applying a voltage across the upper and lower electrodes 14 and 18, causing current to flow through the organic layer 16. Current flow through layer 16 in turn causes the layer's organic material to emit light in all directions.

The dark, low-reflectance film 12 on the substrate 10 blocks light emitted towards the substrate from exiting the pixel. A pixel of this configuration is viewed from above, with the viewer looking towards the upper electrode 18. Because the upper electrode 18, lower electrode 14 and organic layer 16 are transparent, a viewer sees only the dark, low-reflectance film 12 when no voltage is applied across the electrodes 14 and 18; i.e., when the pixel is in its "off" state. The dark film acts to absorb and/or trap ambient light impinging on the pixel, so that the pixel appears dark when off, even in the presence of ambient light. When a voltage is applied across the electrodes 14 and 18, i.e., when the pixel is in its "on" state, light is emitted from the organic layer 16 and through the upper electrode 18 to the viewer. The dark background provided by the organic light-emitting pixel's novel use of low-reflectance film 12 improves the contrast between the pixel's on and off states when compared with prior art pixels, which typically include reflective surfaces that reduce their contrast.

The substrate material is selected depending on the needs of the application. Because light is not emitted through the substrate 10, the substrate need not be transparent, and due to the presence of the dark, low-reflectance film 12, the substrate 10 can even be reflective. If electronic circuitry is to be fabricated on the substrate to drive the pixel, as when a number of pixels are arranged in a two-dimensional array to form an active-matrix display (discussed below), the substrate is preferably silicon, which supports the fabrication of switching and/or driving transistors on the same substrate as the pixel. Alternatively, a metal or diamond substrate may be preferable due to their superior thermal conductivity characteristics, which would aid in dissipating the heat generated by the organic light-emitting pixels.

Dark, low-reflectance layers, though known, have never before been incorporated into the design of a light-emitting pixel. The composition of low-reflectance layer 12 is dependent on the particular application. Acceptable "black matrix" coatings made from alternating layers of chrome and chrome oxide, or silicon and silicon oxide, are available from Optical Coating Laboratory, Inc. in Santa Rosa, Calif., under the "ShadowBand" brand name. An amorphous-SiGe:H compound, or black chrome, may also suffice. The film material should be chosen to be compatible with the materials which make up the other pixel layers, as well as with the processing steps needed to fabricate the pixel.

Dark background coatings of the type described here have been previously used in the fabrication of transparent liquid crystal displays (LCDs). However, because LCDs are a light-modulating device, the dark coating is applied in the form of a grid through which light can pass, which necessarily limits the display's contrast. The invention also uses a dark, low-reflectance film, but as opposed to the LCD's grid arrangement, the film is present even in the area of the pixel from which light is emitted, providing significantly improved contrast. Because the film is used with a light-emitting pixel, there is no need for a contrast-reducing grid in the film.

As noted above, the electrodes 14 and 18 are preferably transparent. The lower electrode 14 typically serves as the pixel's anode, for which a suitable transparent material is indium-tin-oxide (ITO). The upper electrode 18 typically serves as the pixel's cathode. A suitable cathode composition consists of a thin layer such as magnesium-silver (Mg/Ag) which contacts the organic layer 16, made thin enough (typically 50–150 Å) so that it appears semi-transparent. On top of the thin layer is a second, thicker layer of transparent electrode material, such as ITO, which completes the cathode.

The electrodes may also be reversed from the arrangement described above, with upper electrode 18 being the anode and lower electrode 14 being the cathode. Factors influencing this design decision include the processing steps needed to produce the pixel and environmental considerations. For example, ITO is not reactive in air, and is thus well-disposed to serve as the outer, exposed layer of the upper electrode.

Light-emitting organic materials are well-known and are not the subject of this invention. These materials typically include three organic layers: a hole transporting layer, an electroluminescent layer, and an electron transporting layer. Suitable organic materials are discussed, for example, in U.S. Pat. No. 4,885,211 to Tang et al.

Figure 1B:
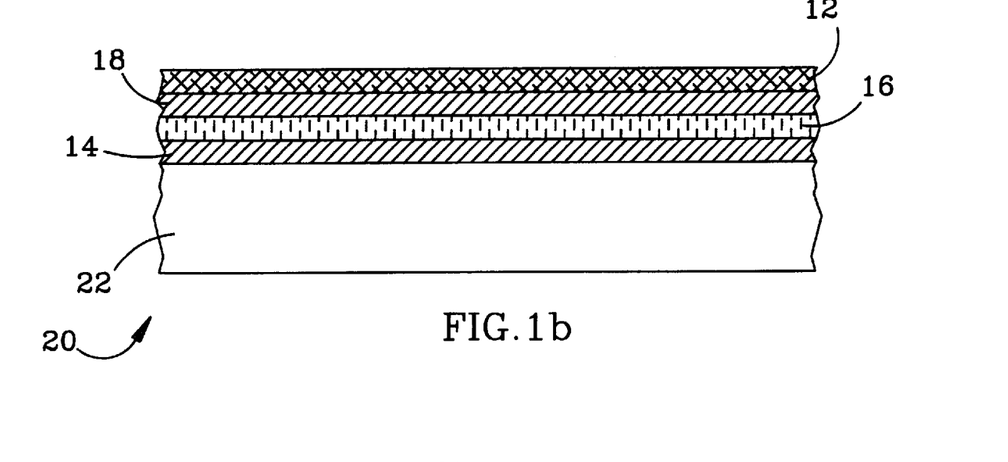
FIG. 1b is a cross-sectional view of an alternative embodiment of an organic light-emitting pixel which includes a dark, low-reflectance film.

An alternative arrangement of pixel material layers is shown in FIG. 1b, which form an organic light-emitting pixel 20. Here, the dark, low-reflectance layer 12 is located above the upper electrode 18, and substrate 22 is transparent. The emitted light is observed through transparent substrate 22, instead of through the transparent upper electrode 18 of FIG. 1a. This configuration allows a low-cost glass substrate to be employed, and may be preferred when fabricating a passive-matrix display, which does not require the silicon substrate preferred for an active-matrix display's drive electronics.

Figure 2A:
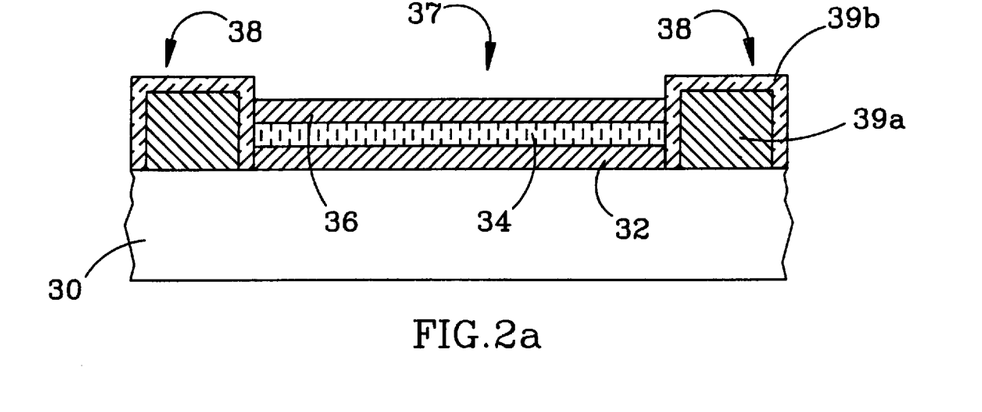
FIG. 2a is a sectional view of an organic light-emitting pixel which includes an optical scattering-reducing wall, taken along section line 2a—2a in FIG. 2b.
Figure 2B:
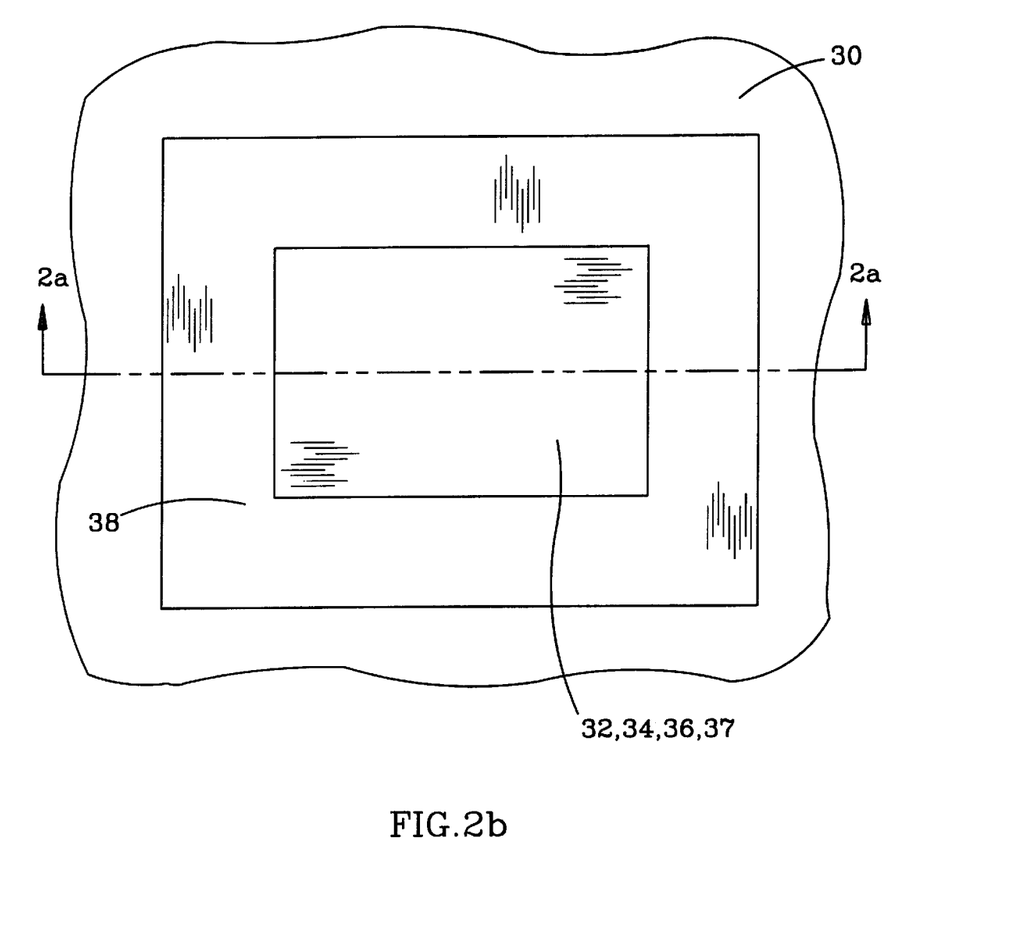

Another innovative organic light-emitting pixel structure is illustrated in the cross-sectional view of FIG. 2a, with a corresponding plan view in FIG. 2b. A substrate 30 has a lower electrode 32 deposited on its surface, followed by an organic layer 34 and an upper electrode 36, forming a pixel 37. A wall 38 is fabricated which completely surrounds the pixel. The wall 38 rises approximately perpendicularly from the substrate 30, and and terminates above the top of the pixel's uppermost layer, which here is upper electrode 36. A practical display is made up of a number of pixels arranged into a two-dimensional array, with most pixels surrounded on all sides by adjacent pixels. The purpose of the wall 38 surrounding the pixel 37 is to reduce the optical scattering to or coupling from adjacent pixels. The wall 38 reduces the scattering of light emitted from pixel 37, and acts to block light emitted from adjacent pixels from coupling with the light output of pixel 37. The walls also act to reduce electrical crosstalk between pixels, as will be discussed in more detail below.

The wall 38 may be formed in a number of ways. In a display made from an array of pixels as discussed above, the walls will be located in the spaces between pixels. The pixel addressing lines are also typically found in these spaces. The addressing lines, typically metal traces, can be used to form part of the wall 38. If additional height is needed to insure that the wall extends above the pixel's uppermost layer, dielectric or metal layers may be deposited as necessary. The width of the walls is not critical: they may be as thin as is practical to fabricate, as long as they remain opaque.

If it is desired that the addressing lines not form part of the wall, the wall can be made entirely of narrow metal strips, dielectric materials, or a combination of both. In FIG. 2a, wall 38 is made from metal strips 39a, which are covered with an insulating dielectric material 39b, to prevent the wall from shorting electrodes 32 and 36 together.

As discussed in connection with FIGS. 1a and 1b, the arrangement of electrodes 32 and 36, and the materials from which they are made, are design-dependent; electrode 32 can serve as either anode or cathode, with electrode 36 being complementary to electrode 32. The material comprising substrate 30 is also design-dependent. Silicon is not necessary if fabricating a passive-matrix display, and is preferred if fabricating an active-matrix display. A glass substrate will provide a largely transparent pixel, but the problem of trapping and reflecting emitted light due to differing refractive indices will be present. An anti-reflective coating on either or both sides of substrate 30 will help reduce the amount of light trapped.

In the case of an active-matrix display, which characteristically locates a pixel's drive circuitry immediately adjacent to its respective pixel, the drive circuitry and associated interconnection traces can also be used to form all or part of the wall 38. This approach is discussed in more detail below.

Figure 3A:
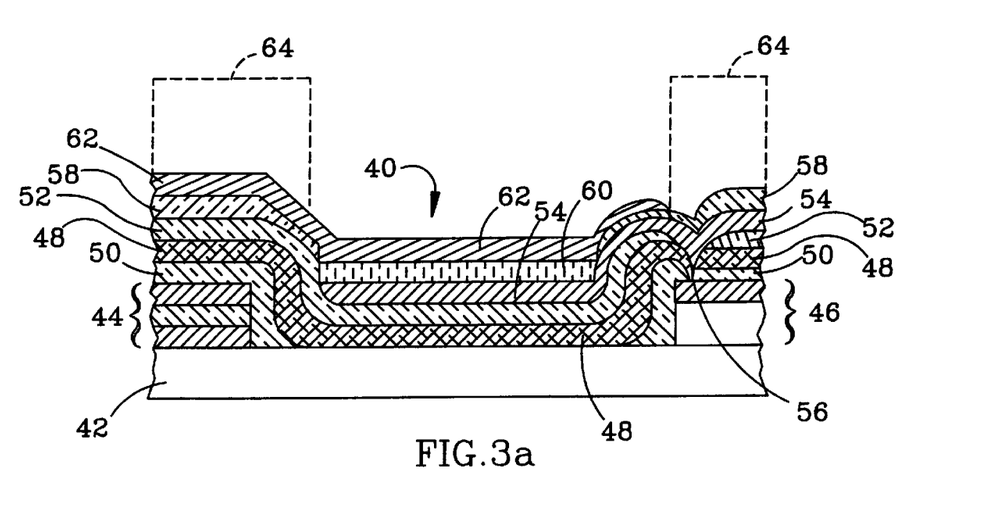
FIG. 3a is a cross-sectional view of an organic light-emitting pixel suitable for use in an active-matrix display, cut along section line 3a—3a in FIG. 3b.

A pixel structure which includes both the dark, low-reflectance film of FIG. 1 and the wall of FIG. 2 is shown in FIG. 3a. A pixel 40 suitable for use in an active-matrix display is shown, but most of the structure is applicable to the formation of a passive-matrix display.

Fabricated atop a substrate 42 are the drive circuitry components associated with pixel 40. A capacitor 44 is formed on one side of the pixel, and a transistor 46 formed on the pixel's opposite side. These components are, of course, not present when fabricating a pixel for use in a passive-matrix display.

A dark, low-reflectance film 48 is located above the drive circuitry, and preferably covers the entire pixel area. If the low-reflectance film 48 is conductive, an insulator layer 50 is placed between the circuitry 44, 46 and the film, to electrically isolate the circuitry from the film. The insulator layer 50 is preferably present only over the drive circuitry, and need not cover the entire pixel area. Similarly, a dielectric layer 52 is placed above the low-reflectance film 48 when the film is conductive, to electrically isolate the film from the layers above it. If dark, low-reflectance film 48 is non-conductive, insulator layer 50 and dielectric layer 52 are unnecessary and may be eliminated from the structure.

A lower electrode 54 is placed above the dielectric layer 52 and/or low-reflectance film 48. A means must be provided by which the lower electrode 54 receives an electrical signal. For example, as shown in FIG. 3a, the lower electrode can be extended on one side and made to contact a conductive surface of the transistor 46, passing through the intervening dielectric, film, and insulator layers by way of a via 56.

Another insulator layer 58 is placed above the lower electrode 54, to electrically isolate from the layers above any portion of the lower electrode not used to induce light emission. Insulator layer 58 is not continuous, and should not extend into the area between capacitor 44 and transistor 46 where the organic material layer is located and where light emission will take place (unless insulator layer 58 is used to define a particular pixel shape, as discussed below).

An organic material layer 60 is above the lower electrode 54, which, as discussed above, is not limited to any particular composition. An upper electrode 62 is located above the organic material layer 60, and as with lower electrode 54, extends on one or both sides as necessary to make electrical contact with the drive circuitry.

If the electrodes and organic material layer 60 can be precisely aligned, so that layers 54 and 62 never touch, insulator layer 58 may not be necessary. However, alignment inaccuracies inherent in the fabrication process make the use of insulator layer 58 advisable.

Insulator layer 58 is also useful to define the boundaries of the "light-emitting region" of the pixel 40. The layer 58 is deposited everywhere but in those regions from which light is to be emitted, so that an unobstructed electrical path from one electrode, through the organic material layer 60 and to the opposite electrode exists only where insulator layer 58 is absent; the pixel's light-emitting region is thus defined by the boundaries of the insulator layer 58.

Figure 3B:
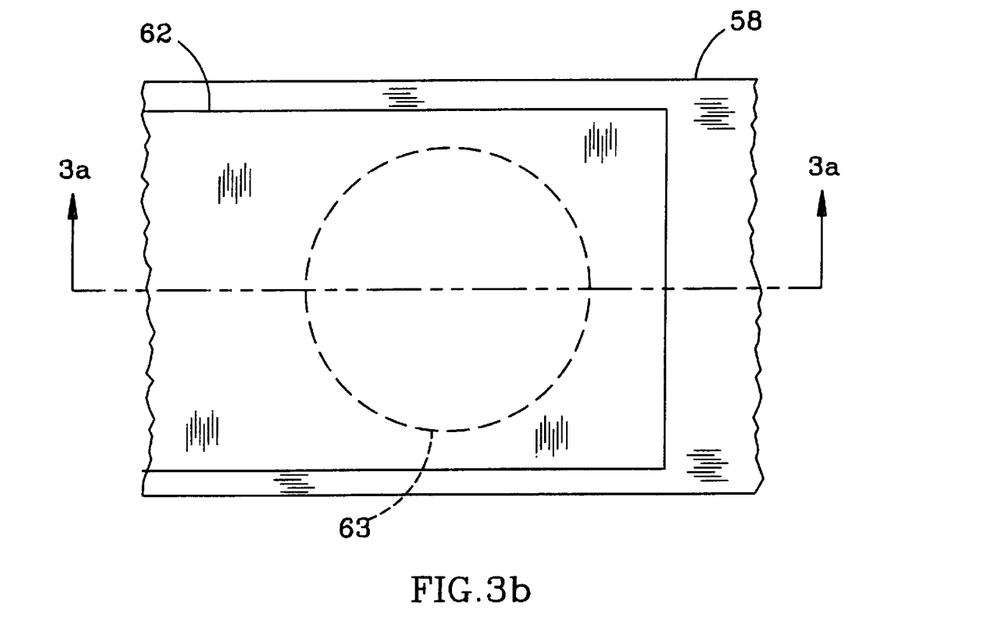
FIG. 3b is a top plan view of the pixel in FIG. 3a, illustrating the use of an insulator layer to create a pixel with a desired shape.

Insulator layer 58 can also be used to create pixels which emit light in a particular pattern, such as a letter, star, or circle. This is done by patterning insulator layer 58 so that the unobstructed electrical path provided between electrodes conforms to the desired emission pattern. An example of this is illustrated in the top plan view of FIG. 3b (showing layers 58 and 62 only for clarity): insulator layer 58 runs below metal cathode layer 62, and serves to insulate the cathode from the layers below it. The insulator layer 58 is continuous under the cathode, with the exception of a circular area 63 in which no insulator material is present. Because an unobstructed electrical path only exists where insulator layer 58 is absent, a circular light-emitting region is created. Other pixel shapes are similarly created. Note that insulator layer 58 blocks the electrical path between upper and lower electrodes whether placed below or above organic layer 60. Either placement is acceptable.

The composition and arrangement of the electrodes 54 and 62 is design-dependent. As noted in connection with FIGS. 1a and 1b, the pixel's electrodes can be arranged such that lower electrode 54 serves as anode and upper electrode 62 serves as cathode, or vice versa. Both electrodes are preferably transparent, so that one viewing the pixel from above sees the dark, low-reflectance film 48 when the pixel is in its off state, with the resulting cenefit of improved contrast.

As noted in conjunction with FIG. 1b above, the dark, low-reflectance film 48 could also be located above the upper electrode 62, and the pixel viewed through substrate 42. In this case, substrate 42 should be transparent. If the low-reflectance film 48 is conductive, an insulating layer should be placed between the upper electrode 62 and the film, to prevent shorting the upper electrode to other areas to which the low-reflectance film may extend. The invention is not limited to any particular composition of low-reflectance film, with, as noted above, a number of acceptable materials known in the art.

The structure of pixel 40 also includes a wall 64 which surrounds its light-emitting region and extends above its upper electrode 62. The wall 64 is preferably comprised of the drive circuitry such as capacitor 44 and transistor 46, interconnection traces such as the extension of lower electrode 54, and structure layers such as Insulator layers 50 and 58 and dielectric layer 52. The drive circuitry and structure layers are stacked atop each other in the spaces between the pixels to form the wall 64, with most of its height typically coming from the drive circuitry and insulator layers. As noted above, the wall must extend above the top surface of the highest pixel layer, typically the upper electrode 62, in order to provide the benefits of reduced optical scattering and is coupling. If an insufficient height is attained with the stacking of the components and layers noted above, additional layers should be fabricated, from dielectric or metal materials, to insure that the wall extends above the light-emitting region.

Dark, low-reflectance film 48 is preferably applied on the surface of substrate 42, and light is thus emitted towards a viewer through the upper electrode 62. As such, substrate 42 need not be transparent. For an active-matrix display, substrate 42 is preferably a semiconductor material such as silicon, and the transistor(s) of the drive circuitry are then fabricated on the same substrate as the pixel. The capability of integrating the drive circuitry and the pixels on a common substrate, as described herein, is another of the present invention's major benefits. The advantages generally attendant to an increased degree of integration are also in evidence here: fabrication time and cost is reduced and reliability is increased. Because the substrate may be silicon instead of glass, crystalline silicon transistors may be implemented, which offer lower leakage currents and higher current-drive capabilities when compared with the polysilicon transistors on a glass substrate of the prior art.

The composition of the insulator layers 50 and 58, as well as dielectric layer 52, are design-dependent; it is only essential that each provide electrical isolation between the components or layers on either side. The ability of these layers to cover the sharp steps of the pixel's wall, the temperatures encountered during subsequent fabrication steps, and the layer' respective refractive indices might all be considered when selecting the materials to use for these layers.

The active-matrix drive circuitry components 44, 46 shown in FIG. 3a are merely illustrative; the actual number, type, and arrangement of components is design-dependent, and drive circuitry design techniques are well-known in the art.

If used in a passive-matrix display, the structure of the pixel 40 would differ from that shown in that the capacitor 44 and transistor 46 would not be present. However, the addressing lines used by a passive matrix display can be run in the spaces between pixels, to provide part of the structure of a surrounding wall in the same way that capacitor 44 and transistor 46 do.

Figure 4A:
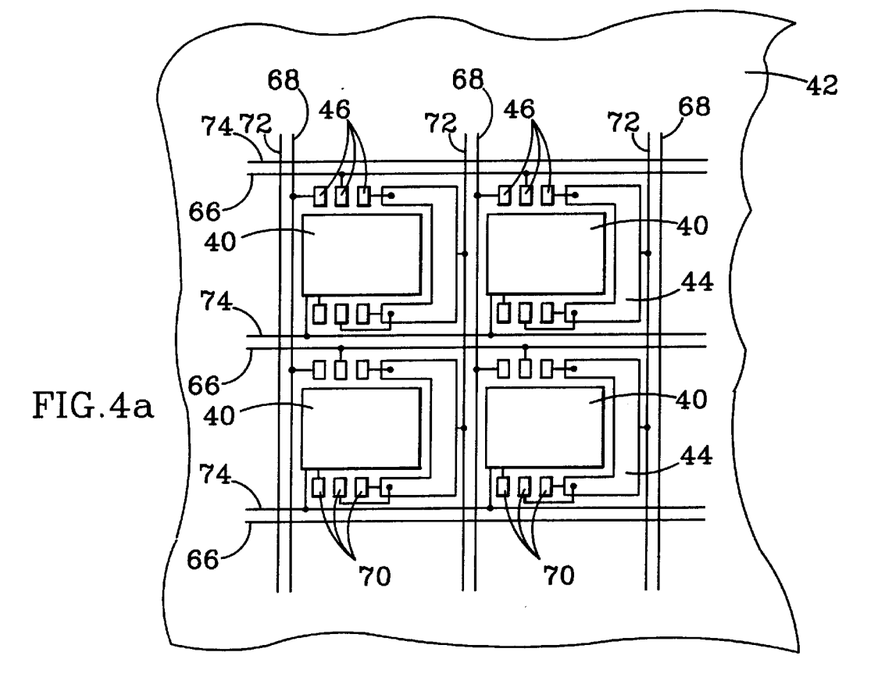
FIG. 4a is a perspective view of an active-matrix display made from organic light-emitting pixels per the present invention.
Figure 4B:
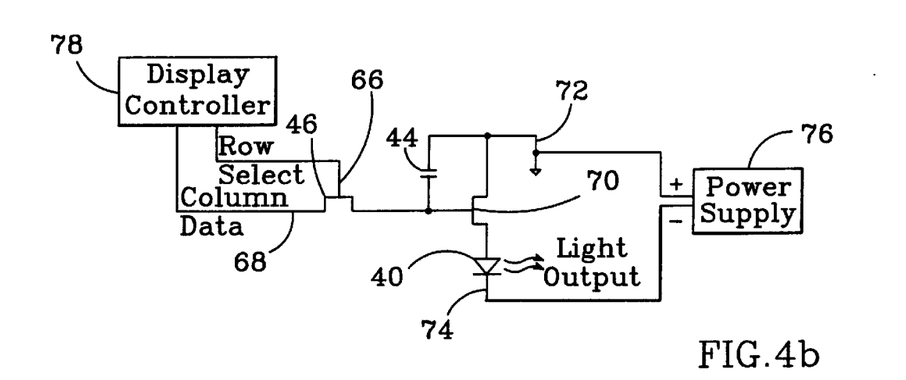
Figure 4C:
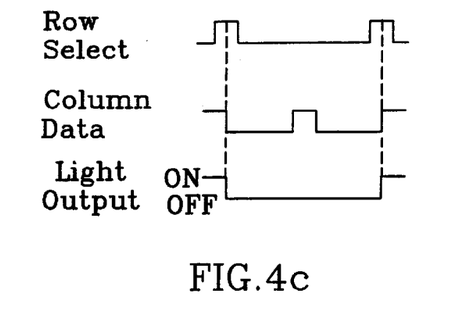
FIG. 4c is a timing diagram for the active-matrix drive circuit of FIG. 4b.

A plan view of an active-matrix display formed from a number of organic light-emitting pixels 40 arranged in a two-dimensional "row and column" array is shown in FIG. 4a, with a design of a pixel's driving circuitry shown in a corresponding schematic shown in FIG. 4b and a timing diagram shown in FIG. 4c. Switching transistor 46 is fabricated on common substrate 42 adjacent to each pixel.

The invention is not limited to any specific transistor type, and may be bipolar or FET, for example. Assuming transistor 46 is a FET, a row select addressing line 66 is connected to the gates of each of the switching transistors in the row, and a column data line 68 is connected to the drain of each of the switching transistors in a column. The switching transistor's source is connected to storage capacitor 44 and to the gate of a driving transistor 70, whose drain is connected to the other side of capacitor 44 and to a ground line 72. Because column data line 68 typically toggles between positive and negative voltages, the source and drain terminals of switching transistor 46 may be reversed in the above discussion.

The capacitor 44 is shown as a U-shaped device that follows the outline of the pixel. The capacitor used with the present invention is not limited to any particular shape or value. If additional surface area is needed, the capacitor 44 may even extend under the pixel itself. The transistors may also utilize the area beneath the pixel if necessary. If the area beneath a pixel is used to accommodate drive circuitry, the circuit components should be located beneath the dark, low-reflectance film 48, so that the invention's contrast improving benefits are retained. If the low-reflectance film is conductive, the circuitry should be beneath an insulator layer 50 as well.

The pixel' respective anodes are connected to the sources of their respective driving transistors, and their cathodes are connected to a negative supply voltage line 74. Pixel 40 emits light when its driving transistor 70 is turned on, which causes current to flow through the organic material between the anode and cathode. With reference to the timing diagram in FIG. 4c, driving transistor 70 turns off (and no light is emitted) when the column data line 68 is low when the row select line 66 is pulsed. Transistor 70 is turned on when the column data line is high, i.e., at ground potential or higher, when the row select line is pulsed; this condition also charges storage capacitor 44, which maintains the pixel's "on" state after the row select line goes low. Transitions of column data line 68 are ignored when row select line 66 is low.

For purposes of seeing the drive circuitry, FIG. 4a does not show the low-reflectance film, nor the various insulator and dielectric layers, discussed in connection with pixel 40 in FIG. 3a. These layers are present, however, and when combined with the circuitry and addressing lines positioned in the spaces between the pixels, form surrounding walls 64 around each pixel. This placement of addressing lines in the spaces between the pixels is in contrast to that usually found in the prior art, where a display's addressing lines are typically run above and below the pixels themselves.

A complete active-matrix display system is provided with the addition of a power supply 76 and a display controller 78 (both shown in FIG. 4b only). The positive and negative terminals of power supply 76 are connected to the ground lines 72 and supply voltage lines 74, respectively, of the active-matrix; "ground" as used herein refers to the voltage at the positive terminal of power supply 76. The display controller 78 manipulates the row select lines 66 and column data lines 68 as necessary to provide a desired image.

Figure 5:
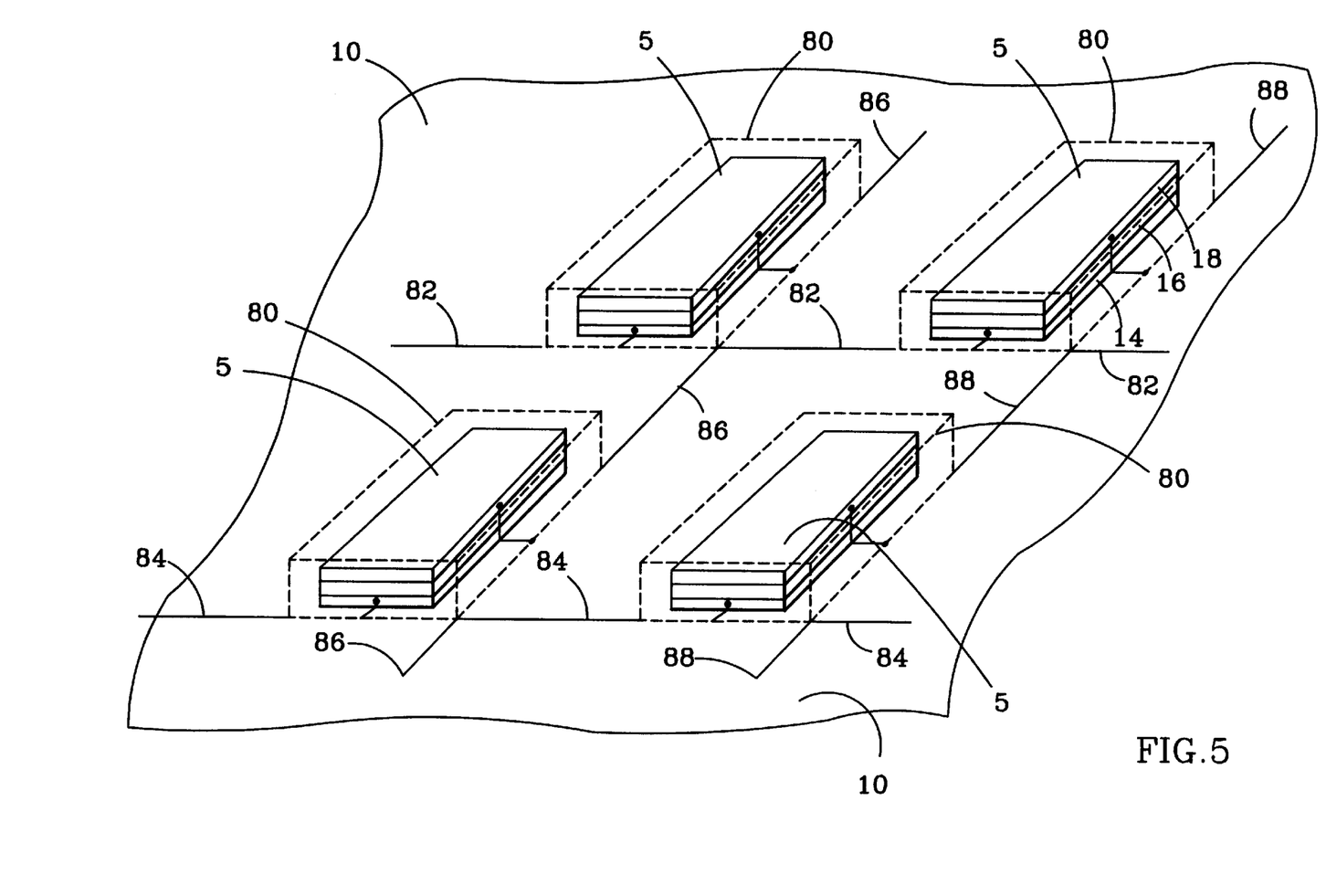
FIG. 5 is a perspective view of a passive-matrix display made from organic light-emitting pixels per the present invention.

A passive-matrix display formed from organic light-emitting pixels per the present invention is shown in FIG. 5. Pixels 5 are fabricated as shown in FIG. 1a, with an anode 14 and cathode 18 sandwiched around an organic material layer 16, with a dark, low-reflectance layer 12 (not shown) between the substrate 10 and the lower electrode. Walls 80 (shown with dashed lines) are formed on all four sides of each pixel to reduce optical scattering and coupling. There is one addressing line 82, 84 per column, which is connected to each pixel anode in the column, and one addressing line 86, 88 per row, which is connected to each pixel cathode in the row. The addressing lines are preferably run in the spaces between the pixels as shown in FIG. 5, so that they serve to provide some of the wall' structure. An individual pixel in the display emits light when the addressing lines are manipulated so that a current is made to flow through the organic material layer of that pixel.

A fabrication method is used to implement the invention's improved contrast organic light-emitting pixels on a common substrate with active-matrix drive circuitry, as follows (with reference to the cross-sectional view of FIG. 3a):

1. Active-matrix drive circuitry components such as capacitor 44 and transistor 46 are fabricated on the substrate 42 first, using standard silicon fabrication methods well-known in the art. The drive components should be placed immediately adjacent to the area which will contain the pixel.

2. The material layers deposited to form the drive circuitry will typically remain after the processing steps for those components are completed. These materials are preferably removed from the areas of the substrate in which the pixels will be fabricated, which keeps the height of the pixel areas as low as possible and begins the formation of the surrounding walls.

3. If the dark, low-reflectance film to be used is a conductive material, deposit the first insulator layer 50. This layer can be patterned so that it covers the drive circuitry only, or continuous. However, it is important that the completed pixel not extend above the top of the walls that will be erected around it. Any material layers which are present in the pixel areas, but unnecessary to the pixel' function, increases the height of the pixels and requires a corresponding increase in the height of the walls. Thus, the first insulator layer 50 is preferably patterned to avoid the presence of insulator material in the pixel areas.

4. Deposit the dark, low-reflectance film 48. This film is to be deposited continuously, covering everything fabricated in steps 1–3.

5. If the dark, low-reflectance film to be used is a conductive material, deposit the dielectric layer 52. Since the dielectric layer serves to electrically isolate the low-reflectance film 48 from the layers above it, the dielectric layer should be continuous and completely cover the low-reflectance film 48.

6. Etch vias 56 through the dielectric and first insulator layers as necessary to provide interconnection paths to the drive circuitry 44, 46.

7. Deposit the lower electrode 54 of the pixel, with one end of the electrode passing through an appropriate via for connection to the drive circuitry and/or addressing lines.

8. Deposit the second insulator layer 58, patterned to define the light-emitting region of the pixel. As illustrated in the top plan view of FIG. 3b, the patterning can be arranged to create a square pixel, or a pixel with a particular shape, such as a letter, star, or circle.

9. Etch vias through the second insulator layer as necessary to provide interconnection paths to the drive circuitry and/or addressing lines for the cathode.

10. Deposit the organic material layer 60, which, because the organic layer may comprise several individual layers, may entail several processing steps. Vias through the organic layer(s) may need to be patterned to provide an electrical connection to the upper electrode.

11. Deposit the upper electrode 62 of the pixel, with one end of the electrode passing through an appropriate via for connection to the drive circuitry and/or addressing lines.

12. Encapsulate the light-emitting region of the pixel, with silicon dioxide or glass, for example, to protect the pixel layers from environmental exposure. If glass is used, an anti-reflective coating should be applied to the glass' pixel side.

The drive circuitry and interconnection lines arranged around the pixel, and the pixel layers themselves, form a wall 64 around the pixel. The height of the wall is sufficient if it exceeds the height of the top surface of the upper electrode. If it does not, additional dielectric or metal deposition steps should be performed in the areas surrounding the pixel until the height of the wall is sufficiently high.

In addition to the reduction in optical scattering and coupling, the walls around the pixels provide another benefit. When an array of pixels is fabricated, the organic material layer is typically deposited as a continuous layer over the array. The deposition is usually accomplished by evaporation, which, if the sides of the walls are steep enough, provides little to no coverage of the vertical sides of the walls. The walls thus serve to partition the organic layer so that each pixel has its own distinct square of organic material, which reduces the optical and electrical crosstalk between pixels when compared with a continuous organic material layer as used in the prior art. The walls should be at least $10\mu$ thick and as steep as possible to help insure the partitioning of the organic layer.

While particular embodiments of the invention have been shown and described, numerous variations and alternate embodiments will occur to those skilled in the art. Accordingly, it is intended that the invention be limited only in terms of the appended claims.

I claim:

1. An improved contrast organic light-emitting pixel, comprising:

a support body having a low-reflectance surface, said support body comprising:

a substrate, and a dark low-reflectance film on said substrate, a lower electrode on said low-reflectance film, an upper electrode, and an organic material layer sandwiched between said lower and upper electrodes and forming a light-emitting region with said electrodes, said light-emitting region emitting light when a voltage is applied across said electrodes, said low-reflectance surface improving the contrast between on and off states of said pixel when said pixel is viewed through said upper electrode.

2. The organic light-emitting pixel of claim 1, wherein said substrate is silicon.

3. The organic light-emitting pixel of claim 2, further comprising at least one crystalline silicon transistor and at least one capacitor fabricated on said substrate with said pixel, said transistor and capacitor forming a circuit arranged to apply said voltage across said upper and lower electrodes.

4. The organic light-emitting pixel of claim 3, wherein at least a portion of said at least one capacitor and said at least one transistor are arranged under said low-reflectance layer.

5. The organic light-emitting pixel of claim 3, further comprising a first insulator layer between said transistor and capacitor and said low-reflectance film to electrically isolate said transistor and capacitor from said film.

6. The organic light-emitting pixel of claim 3, further comprising a plurality of additional pixels having respective transistors and capacitors forming respective circuits arranged to apply voltages across the upper and lower electrodes of respective pixels, said plurality of pixels arranged in a two-dimensional array and forming an active-matrix display.

7. The organic light-emitting pixel of claim 1, wherein said low-reflectance film is present beneath the light-emitting region of said pixel.

8. The organic light-emitting pixel of claim 1, further comprising a second insulator layer above said lower electrode arranged to block the electrical path between said lower and upper electrodes except in said light-emitting region, said second insulator layer defining the size and shape of said light-emitting region.

9. The organic light-emitting pixel of claim 8, wherein said second insulator layer is patterned to produce a light-emitting region with a desired shape.

10. The organic light-emitting pixel of claim 1, wherein said lower and upper electrodes are transparent.

11. An improved contrast organic light-emitting pixel, comprising:

a transparent substrate, a lower electrode on said substrate, an upper electrode, an organic material layer sandwiched between said lower and upper electrodes and forming a light-emitting region with said electrodes, said light-emitting region emitting light when a voltage is applied across said electrodes, and a dark, low-reflectance film on said upper electrode, said low-reflectance film improving the contrast between said pixel's on and off states when said pixel is viewed through said substrate.

12. An improved contrast organic light-emitting pixel, comprising:

a substrate, a lower electrode on said substrate, an upper electrode, an organic material layer sandwiched between said lower and upper electrodes and forming a light-emitting region with said electrodes, said light-emitting region emitting light when a voltage is applied across said lower and upper electrodes, and an opaque wall which surrounds said light-emitting region, rises above the upper electrode of said light-emitting region and optically isolates said region from any adjacent light-emitting regions, said wall reducing the crosstalk between said pixel and any adjacent pixels.

13. The organic light-emitting pixel of claim 12, wherein said substrate is silicon.

14. The organic light-emitting pixel of claim 13, further comprising at least one crystalline silicon transistor and at least one capacitor fabricated on said substrate with said pixel, said transistor and capacitor forming a circuit arranged to apply said voltage across said upper and lower electrodes.

15. The light-emitting pixel of claim 14, further comprising a plurality of additional pixels having respective transistors and capacitors forming respective circuits arranged to apply voltages across the upper and lower electrodes of respective pixels, said plurality of pixels arranged in a two-dimensional array and forming an active-matrix display in which each pixel's respective wall reduces the optical scattering and coupling between pixels when compared with an active-matrix display without said walls.

16. The organic light-emitting pixel of claim 14, wherein said at least one capacitor and said at least one transistor are arranged around said pixel and form part of the structure of said wall.

17. The organic light-emitting pixel of claim 12, wherein said wall comprises thin metal strips.

18. An improved contrast organic light-emitting pixel, comprising:

a substrate, a dark, low-reflectance film on said substrate, a lower electrode on said low-reflectance film, an upper electrode, an organic material layer sandwiched between said lower and upper electrodes and forming a light-emitting region with said electrodes, said light-emitting region emitting light when a voltage is applied across said lower and upper electrodes, and an opaque wall which surrounds said light-emitting region and rises above the upper electrode of said light-emitting region and optically isolates said region from any adjacent light-emitting regions, said wall reducing the crosstalk between said pixel and any adjacent pixels and said low-reflectance film improving the contrast between said pixel's on and off states when said pixel is viewed through said upper electrode.

19. The organic light-emitting pixel of claim 18, wherein said substrate is diamond.

20. The organic light-emitting pixel of claim 18, wherein said substrate is metal.

21. The light-emitting pixel of claim 18, wherein said organic material layer comprises a hole transporting layer, an electroluminescent layer, and an electron transporting layer.

22. An organic light-emitting pixel, comprising:

a substrate, a lower electrode on said substrate, an upper electrode, an organic material layer sandwiched between said lower and upper electrodes and forming a light-emitting region with said electrodes, said light-emitting region emitting light when a voltage is applied across said lower and upper electrodes, and an insulator layer above said lower electrodes patterned in a desired shape to partially block the electrical path between said lower and upper electrodes and to leave an unobstructed electrical path of said desired shape between the electrodes, said organic material layer emitting a light pattern in said desired shape.

23. An improved contrast organic passive-matrix light-emitting display, comprising:

a substrate, a plurality of light-emitting pixels formed on said substrate and arranged in a two-dimensional array, each pixel comprising:
   a low-reflectance film on said substrate,
   a lower electrode on said low-reflectance film,
   an upper electrode,
   an organic material layer sandwiched between said upper and lower electrodes and forming a light-emitting region with electrodes, said light-emitting region emitting light when a voltage is applied across said upper and lower electrodes, and
   an opaque wall which surrounds said light-emitting region and rises above the upper electrode of said light-emitting region to optically isolate said region from adjacent light-emitting regions, and a plurality of addressing lines interconnecting said upper and lower electrodes and arranged to selectably apply voltages across the respective upper and lower electrodes of individual pixels.

24. An improved contrast organic active-matrix light-emitting display, comprising:

a substrate, a plurality of pixels formed on said substrate and arranged in a two-dimensional array, each pixel comprising:
   a low-reflectance film on said substrate,
   a lower electrode on said low-reflectance film
   an upper electrode,
   an organic material layer sandwiched between said upper and lower electrodes and forming a light-emitting region with said lower electrode on said low-reflectance film, said light-emitting region emitting light when a voltage is applied across said upper and lower electrodes, and
   an opaque wall which surrounds said light-emitting region and rises above the upper electrode of said light-emitting region to optically isolate said region from adjacent light-emitting regions, a plurality of transistors, each transistor connected to an electrode of a respective light-emitting pixel, and a plurality of addressing lines arranged to operate said transistors such that voltages are selectably applied across the respective upper and lower electrodes of individual pixels.

25. The active-matrix display of claim 24, wherein said substrate supports said addressing lines and forms part of the structure of said transistors.

26. The active-matrix display of claim 24, further comprising a plurality of capacitors, each capacitor interconnected with a respective one of said transistors.

27. The active-matrix display of claim 26, wherein each of said pixels is connected to a respective drive circuit comprising at least two of said transistors and one of said capacitors, said drive circuit adjacent to said pixel and supported by said substrate.

28. The active matrix display of claim 24, wherein said transistors and addressing lines are arranged around said pixel and form part of the structure of their respective walls.

29. An improved contrast organic light-emitting active-matrix display system, comprising:

a substrate, a plurality of pixels formed on said substrate and arranged in a two-dimensional array, each pixel comprising:
   a low-reflectance film on said substrate,
   a lower electrode on said low-reflectance film,
   an upper electrode,
   an organic material layer sandwiched between said upper and lower electrodes and forming a light-emitting region with said lower electrode on said low-reflectance film, said light-emitting region emitting light when a voltage is applied across said upper and lower electrodes, and
   an opaque wall which surrounds said light-emitting region and rises above the upper electrode of said light-emitting region to optically isolate said region from adjacent light-emitting regions, a plurality of transistors, each transistor connected to an electrode of a respective light-emitting pixel, a plurality of addressing lines arranged to operate said transistors such that voltages are selectably applied across the respective upper and lower electrodes of individual pixels, a power source connected to provide said voltages across the respective upper and lower electrodes of individual pixels, a display controller arranged to manipulate said addressing lines to produce a desired image on said array of pixels.

30. An improved contrast organic light-emitting pixel, comprising:

a support body having low-reflectance surface, a lower electrode on said low-reflectance surface, an upper electrode, and an organic material layer sandwiched between said lower and upper electrodes and forming a light-emitting region with said electrodes, said light-emitting region emitting light when a voltage is applied across said electrodes, said low-reflectance surface improving the contrast between on and off states of said pixel when said pixel is viewed through said upper electrode.

31. The organic light-emitting pixel of claim 22, having a single electrode pair comprising said lower and upper electrodes.

* * * * *